United States Patent [19]

Kano et al.

[11] Patent Number: 4,925,810
[45] Date of Patent: May 15, 1990

[54] COMPOUND SEMICONDUCTOR DEVICE AND A METHOD OF MANUFACTURING THE SAME

[75] Inventors: Hiroyuki Kano, Aichi; Takatoshi Kato; Masafumi Hashimoto, both of Nagoya, all of Japan

[73] Assignee: Kabushiki Kaisha Toyota Chuo Kenkyusho, Aichi, Japan

[21] Appl. No.: 397,367

[22] Filed: Aug. 24, 1989

Related U.S. Application Data

[63] Continuation of Ser. No. 97,843, Sep. 17, 1987, abandoned.

[30] Foreign Application Priority Data

Oct. 25, 1986 [JP] Japan ................................. 61-254141

[51] Int. Cl.$^5$ ..................... H01L 21/203; H01L 21/20
[52] U.S. Cl. ............................. 437/105; 148/DIG. 17; 148/DIG. 26; 148/DIG. 97; 148/DIG. 169; 156/612; 437/90; 437/85; 437/99; 437/107; 437/132; 437/939; 437/946; 437/976

[56] References Cited

U.S. PATENT DOCUMENTS

| | | | |
|---|---|---|---|
| 3,766,447 | 10/1973 | Mason | 437/132 |
| 4,551,394 | 11/1985 | Betsch et al. | 357/16 |
| 4,614,564 | 9/1986 | Sheldon et al. | 437/132 |
| 4,657,603 | 4/1987 | Kruehler et al. | 437/132 |
| 4,707,216 | 11/1987 | Morkoc et al. | 156/610 |

FOREIGN PATENT DOCUMENTS

| | | | |
|---|---|---|---|
| 0098823 | 7/1980 | Japan | 437/132 |
| 0094318 | 5/1986 | Japan | 437/132 |
| 0188927 | 8/1986 | Japan | 437/132 |

OTHER PUBLICATIONS

Choi et al., "Monolithic Integration of Si and GaAs Devices," Mat. Res. Soc. Symp., vol. 67, 1986, pp. 165-171.
Fischer et al., "Monolithic Integration of GaAs/Al- GaAs ... Silicon Circuits," Appl. Phys. Lett., 49(9), 1 Nov. 1985, pp. 983-985.
Otsuka et al., "Observation of GaAs/Si Epitaxial Interfaces ...," Mat. Res. Soc. Symp., vol. 67, 1986, pp. 85-92.
Wang, "Molecular Beam Epitaxial Growth and Material Properties of GaAs and AlGaAs on Si(100)," Appl. Phys. Lett. 44(12), 15 Jun. 1984, pp. 1149-1151.
Takahashi et al., "Selective MOCVD Growth of GaAlAs on Partly Masked Substrates ... ", J. Grys. Growth 68(1984), pp. 206-213.
Lee et al., "... Selective-Area Molecular Beam Epitaxy of GaAs Film on Si Substrate," Appl. Phys. Lett. 52(3), 18 Jan. 1988, pp. 215-217.
Metze et al., "... GaAs Layers Grown Directly on Si Substrates by Molecular Beam Epitaxy," Appl. Phys. Lett. 45(10), 15 Nov. 1984, pp. 1107-1109.
Masselink et al., "Optical Properties of GaAs on (100)Si Using Molecular Beam Epitaxy," Appl. Phys. Lett., 45, 1984, pp. 1309-1311.

*Primary Examiner*—Brian E. Hearn
*Assistant Examiner*—William Bunch
*Attorney, Agent, or Firm*—Oliff & Berridge

[57] ABSTRACT

A compound semiconductor device comprises a substrate formed from a single crystal of silicon, a layer of an insulator formed on a portion of a surface of the substrate, at least one layer of a high resistance compound semiconductor formed on the insulator layer, and at least one layer of a single crystal of a compound semiconductor formed on a different portion of the substrate surface from the insulator layer. The device can be manufactured by forming an insulator layer on one portion of a surface of a single crystal silicon substrate, and growing a compound semiconductor by epitaxy on the insulator layer and on the different portion from the insulator layer. One of useful applications is a hybrid semiconductor device having a compound semiconductor formed from e.g. GaAs on a silicon substrate.

6 Claims, 5 Drawing Sheets

COMPOUND SEMICONDUCTOR DEVICE AND A METHOD OF MANUFACTURING THE SAME

This is a Continuation of application Ser. No. 07/097,843 filed Sept. 17, 1987 now abandoned.

BACKGROUND OF THE INVENTION

1. Field of the Invention

This invention relates to a compound semiconductor device which can be used as, for example, a diode, transistor, or light-emitting diode. More particularly, it is a compound semiconductor device comprising a semiconductor device and a compound semiconductor device which are formed from silicon and a compound of Group III and V elements, such as GaAs, respectively, on a common silicon substrate. It also relates to a method of manufacturing any such compound semiconductor device.

2. Description of the Prior Art

A semiconductor device is usually formed in a very thin layer and requires a substrate defining a region in which such a layer can be formed. Silicon has an advantage over gallium arsenide (GaAs) as a substrate material. A substrate of GaAs having a large diameter is difficult to produce, since GaAs is more brittle than silicon and has a higher specific gravity. On the other hand, the manufacture of a silicon substrate has a long history and reliable techniques are already available for producing a silicon substrate having a large diameter and only a few crystal lattice defects. Therefore, if it is possible to realize a compound semiconductor device comprising GaAs on a silicon substrate, it is expected to bring about a number of great advantages including the possibility of large-scale integration and the use of apparatus which are already available for techniques involving silicon. However, even if a crystal of GaAs can be grown satisfactorily on a silicon substrate, difficulty arises if the GaAs crystal forms a uniform layer covering the whole surface of the substrate, since the realization of an integrated device requires the electrical isolation of elements formed in a plane.

The conventionally available techniques for such electrical isolation include the injection of protons into a GaAs layer to raise its resistance, as shown in FIG. 3, and the spatial separation of elements by mesa etching, as shown in FIG. 4. These techniques, however, have a number of problems which will hereinafter be pointed out. It is feared that these problems may have a serious effect on the future development of a novel hybrid integrated circuit device including a combination of silicon and GaAs elements.

FIG. 3 shows the cross sectional construction of a conventionally known compound semiconductor device by way of example. It comprises a silicon substrate 21, a plurality of GaAs elements 22 having a thickness (t) of at least 2 $\mu$m, a plurality of high resistance GaAs layers 23 formed by proton injection and having a thickness which is smaller than 1 $\mu$m, and a plurality of single-crystal GaAs layers 24. According to the conventional technique employed for producing the device of FIG. 3, however, the protons are injected into the GaAs layers through their surfaces remote from the substrate and reach only a limited depth therein. The GaAs elements sometimes have a relatively large thickness in the order of several microns, as they often comprise a plurality of layers of GaAs and $Al_xGa_{(1-x)}As$ ($0 < X \leq 1$) having a proper lattice alignment. Therefore, the conventional technique for proton injection can only form the high resistance GaAs layers 23 on the surfaces of the single-crystal GaAs layers 24, as shown in FIG. 3, leaving conductive portions adjacent to the substrate. There is every likelihood that the injection of protons may fail to achieve any satisfactory isolation of GaAs elements. The injection of protons presents a still more important problem. The high resistance layers which are formed by the injection of protons decrease their resistance when heated at a temperature of about 450° C. Moreover, the injection of protons can only be carried out as the final step of the process for producing a semiconductor device and therefore imposes a serious restriction on the degree of freedom in any preceding step of the process.

Referring now to FIG. 4, there is shown another conventionally known compound semiconductor device. It includes a plurality of GaAs elements 22 formed by mesa etching, i.e. by etching away any other portion 25 of a GaAs layer around the trapezoidal elements. This technique can completely isolate the elements from each other. However, each portion 25 that has been etched away leaves a considerably large area between the elements, as some material would otherwise be likely to remain unremoved therebetween and disable their complete isolation. Moreover, the use of the etching technique unavoidably results in an uneven substrate surface. The unevenness of the substrate surface can give rise to a serious problem in connection with the manufacture of an integrated circuit device of multilayer construction, especially because it is very likely to cause breakage of electrical interconnections and their improper insulation.

Apart from the difficulty of isolation, the growth of a uniform single-crystal GaAs layer on silicon has also the disadvantage that it easily cracks, since GaAs has a coefficient of thermal expansion which differs from that of silicon.

SUMMARY OF THE INVENTION

It is an object of this invention to overcome the drawbacks of the prior art as hereinabove pointed out, i.e. (a) the difficulty of isolation, and (b) the cracking which is due to the difference in coefficient of thermal expansion, and provide an improved compound semiconductor device which comprises, for example, a gallium arsenide (GaAs) element or a combination of silicon and GaAs elements on a silicon substrate.

It is another object of this invention to provide a method of manufacturing an improved compound semiconductor device.

The device of this invention comprises:
a substrate formed from a single crystal of silicon;
a layer of an insulator formed on one portion of a surface of the substrate;
at least one layer of a high resistance compound semiconductor formed on the layer of an insulator; and
at least one layer of a single crystal of a compound semiconductor formed in a single phase on the remaining portion of the surface of the substrate and having a regularly repeating arrangement of atoms.

The following are some preferred features of the device according to this invention:
(1) The layer of an insulator is a layer of at least one of $SiO_2$, $Si_3N_4$ and $Al_2O_3$; and
(2) The layer of a compound semiconductor is a layer of at least one of GaAs and AlGaAs.

The method of this invention comprises:

the first step of forming a layer of an insulator on one portion of a surface of a substrate formed from a single crystal of silicon; and the second step of heating the substrate at a temperature of at least 1000° C. for a period of at least 5 minutes in an ultrahigh vacuum having a pressure not exceeding $10^{-10}$ torr, lowering the temperature to a level not exceeding 600° C., applying to the substrate a molecular beam of one of compound semiconductor forming elements which is volatile, while raising the temperature to a range of 550° C. to 750° C., and applying molecular beams of those elements together to the substrate to grow a compound semiconductor by epitaxy, whereby a compound semiconductor layer having a regularly repeating arrangement of atoms is formed on a different portion of the substrate surface from the layer of an insulator, while a high resistance compound semiconductor layer is formed on the layer of an insulator.

The following are some preferred features of the method according to this invention:

(1) Group III and V elements are mainly used as the compound semiconductor forming elements;

(2) The single crystal of silicon has surface orientation (100), and the temperature at which the substrate is heated in an ultrahigh vacuum ranges from 1000° C. to 1050° C.;

(3) At least one of Ga and Al is used as the Group III element, while As is used as the Group V element, and GaAs or $Al_xGa_{(1-x)}As$ ($0 < X \leq 1$) or both are grown by epitaxy on the substrate;

(4) The molecular beam of the Group V element has a flux ratio of 1 to 5 to that of the Group III element and the epitaxy has a rate of 0.5 to 2 $\mu$m/h.; and (5) The heating of the substrate in an ultrahigh vacuum and the epitaxy are carried out in different vacuum chambers.

The inventors of this invention found that if a compound semiconductor, such as GaAs, was grown a single-crystal silicon substrate by molecular beam epitaxy directly without the growth of any buffer layer, a single crystal of e.g. GaAs grew on the substrate, and a high resistance polycrystalline or amorphous layer of e.g. GaAs on a layer of an insulator, such as $SiO_2$, on the substrate. Therefore, they thought of using the single crystal of e.g. GaAs to form compound semiconductor elements, and the high resistance compound semiconductor to isolate the elements. they also found that the single crystal layer had a different amount of stress from the polycrystalline or amorphous layer and was less likely to crack. As a result, they have concluded that it is possible to overcome the drawbacks of the prior art if a layer of an insulator is first formed on a portion of a surface of a single-crystal silicon substrate, and if a compound semiconductor layer is, then, formed thereon by molecular beam epitaxy.

Reference is made to FIGS. 1 and 2 showing the basic construction of the compound semiconductor device according to this invention. An insulator layer 12 which is composed of $SiO_2$ or $SiN_x$ is formed by thermal oxidation or nitriding on that surface of a p- or n-type silicon substrate 11 in which a single crystal of silicon has its (100) face, or a different insulator layer 12 is formed by deposition by another method. The insulator layer 12 is partly etched away to expose the surface of the silicon substrate partly. A crystal of GaAs or AlGaAs, or both, is grown by molecular beam epitaxy (MBE) on the surface of the substrate 11 which is partly covered by the insulator layer 12. Thus, a layer 13 of a single crystal of a compound semiconductor, such as GaAs, is formed on the exposed surface of the substrate 11, while a layer 14 of a high resistance compound semiconductor, such as GaAs, is formed on the insulator layer 12. The layer 13 may be a layer of a single compound semiconductor, such as GaAs, or may alternatively comprise a combination of layers of different compound semiconductors, such as a crystal of GaAs and a crystal of $Al_xGa_{(1-x)}As$ ($0 < X \leq 1$) which can be grown by heteroepitaxy. The substrate 11 underlying the layer 13 may also have a layer structure containing a p- or n-type diffusion layer, if the layer 13 is formed on the exposed surface of the substrate 11.

If a plurality of insulator layers 12 are arranged in an appropriate pattern on the substrate 11, it is possible to form a plurality of layers 13 of a single crystal of a compound semiconductor which are electrically isolated from one another by a plurality of layers 14 of a high resistance compound semiconductor. If these crystals are provided with appropriate connections and electrodes, it is possible to obtain a compound semiconductor device.

The insulator layer may be formed from $SiO_2$, $Si_3N_4$, $Al_2O_3$, etc. The compound semiconductor which is particularly preferred is GaAs or AlGaAs, or a combination thereof. This invention is also applicable to a silicon substrate on which a particular combination of semiconductor elements are already formed.

Referring to the method of this invention, the inventors have made a thorough study of the optimum conditions for the heat treatment to which a silicon substrate which has been cleaned is subjected prior to the growth of a GaAs crystal thereon. As a result, they have succeeded in eliminating the necessity for the growth of a buffer layer which takes place at a low temperature, and which has been a source of the trouble encountered by the conventional method. The method of this invention comprises the step of heating a silicon substrate, and the step of growing a crystal of GaAs thereon by molecular beam epitaxy using the same conditions as those which are usually employed for growing any such crystal on a GaAs substrate. The method eliminates the step of growing a buffer layer and can produce a structure having no buffer layer and thereby overcome the following drawbacks of the prior art that are due to the presence of a buffer layer:

(1) It is difficult to always form a buffer layer of the same quality since the conditions under which buffer layer grows are not fully known as yet; a variation in quality of a buffer layer means a variation in quality of a GaAs crystal which is grown thereon, i.e. it is difficult to reproduce GaAs crystals of uniform quality;

(2) The presence of a buffer layer also has an adverse effect on the stability of a GaAs layer as time goes by; and (3) A more complicated process is required than when growing GaAs on a GaAs substrate.

The method of this invention basically comprises the step of heating a substrate having a surface in which a crystal of silicon has its (100) face, in an ultrahigh vacuum having a pressure not exceeding $10^{-10}$ torr, after cleaning it, and the step of growing a crystal of GaAs or any other compound semiconductor on the substrate surface by molecular beam epitaxy.

The cleaning of the substrate which is going to be heated may be accomplished by a customary method, i.e. by degreasing it with an organic solvent and subjecting it to the surface treatment by a chemical etching solution which is repeated several times. The substrate which has been cleaned has a surface covered by a film of $SiO_2$. This film protects the surface of the substrate until it is heated. Then, the substrate is placed in a chamber defining an ultrahigh vacuum. It is gradually heated to a temperature of 800° C. to 900° C., whereby $SiO_2$ and SiC are removed from its surface. Then, its temperature is raised to a range of 1000° C. to 1050° C., so that its surface may take a crystal form having a regularly repeating arrangement of atoms which facilitates the growth of GaAs thereon. If it is heated at a temperature of 800° C. to 900° C. silicon surface forms mono atomic layer steps. If it is further heated at 1000° C. to 1050° C., it is apparent that surface layer comes to form bi-atomic layer steps which improve the arrangement of atoms in the direction in which a binary crystal of a Group III-V compound semiconductor is grown, and thereby enables the growth of a single phase crystal of the compound semiconductor. If the step is one which is formed by mono atomic layer, it forms an antiphase domain boundary which disables the growth of a perfect single phase. The molecular beam epitaxy is carried out under the same conditions as those which are employed for growing a crystal of GaAs on a GaAs substrate, i.e. the substrate is heated to a temperature of 550° C. to 750° C., the molecular beam of a Group V element has a flux ratio of 1 to 5 to that of Group III element, and the crystal is grown at a rate of 0.5 to 2 μm/h.

Although the foregoing description has been made by referring particularly to GaAs as the Group III-V compound semiconductor, it is alternatively possible to employ $Al_xGa_{(1-0)}As$ ($0 < X \leq 1$), or a combination thereof with GaAs. It is also possible to use other similar Group III-V compound semiconductors, such as InP, InGaAsP, GaP and GaSb.

According to this invention, it is also possible to produce a device of the type in which, for example, the electrical characteristics of a heterojunction between GaAs and Si are effectively utilized. Therefore, it is, for example, possible to produce a solar cell of the multiple wavelength type having an improved efficiency by utilizing the window effect which a GaAs layer exhibits at a wavelength which is sensitive to silicon.

DETAILED DESCRIPTION OF THE INVENTION

The invention will now be described in further detail with reference to several examples thereof. The following description is, however, not intended to limit the scope of this invention.

Figure 1:
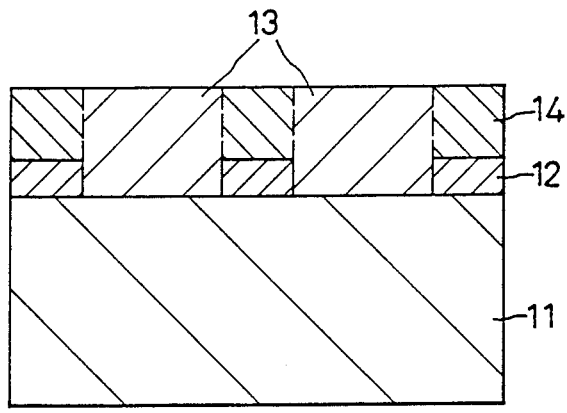
FIGS. 1 and 2 are each a cross sectional view showing the basic construction of a compound semiconductor device embodying this invention.
Figure 2:
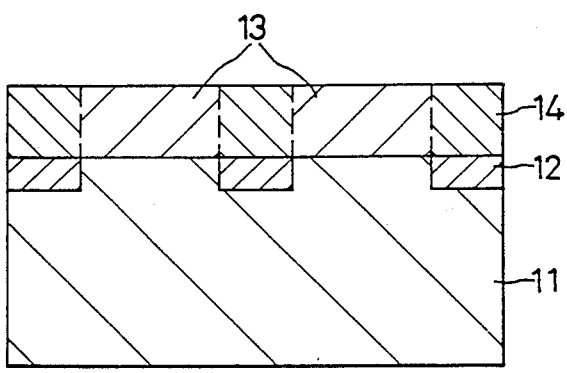
Figure 3:
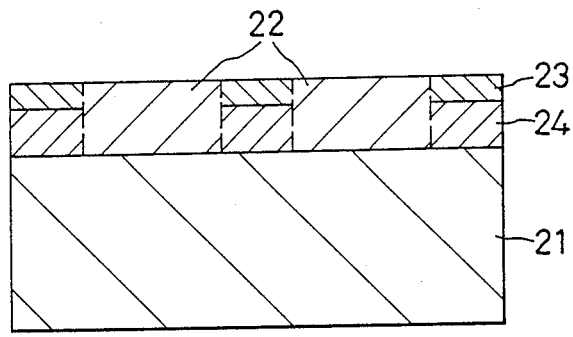
FIGS. 3 and 4 are each a cross sectional view of a conventionally known compound semiconductor device.
Figure 4:
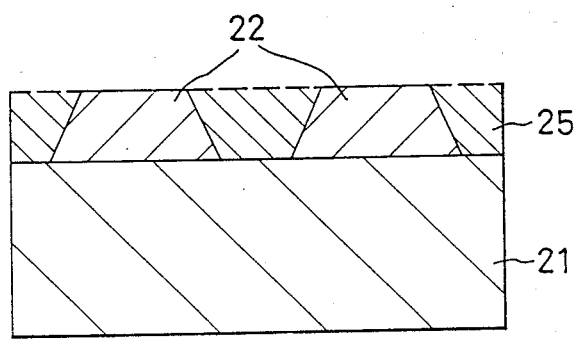
Figure 5:
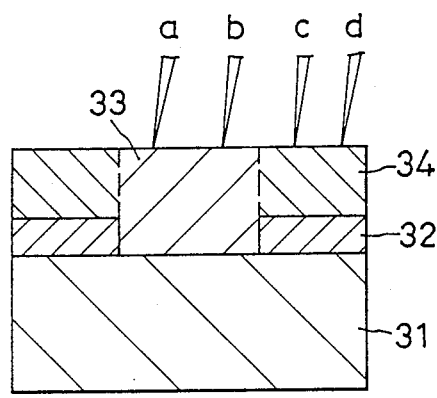
FIG. 5 is a cross sectional view of a compound semiconductor device according to a first example of this invention.

Referring first to FIG. 5, there is shown in cross section a compound semiconductor device according to a first example of this invention. The following is a description of the way in which the device was prepared. An insulator layer 32 comprising a film of $SiO_2$ having a thickness of 5000 Å was formed by a customary process of thermal oxidation on a p-type silicon substrate 31 having a diameter of 2 in., a resistivity ($\rho$) of 5Ω cm, and a surface in which a crystal of silicon had its (100) face. A rectangular hole was formed through the insulator layer 32 by a method employing a photoresist to expose a portion of the surface of the substrate 31. The substrate 31 carrying the insulator 32 was washed with D.I. (deionized) water, dipped for about five minutes in a solution containing $H_2SO_4$ and $H_2O_2$ in a mixing ratio of 4:1, rinsed with D.I. (deionized) water, cleaned by a 5% by weight HF solution, whereby a thin oxide film which had been formed when it was dipped in the mixed solution of $H_2SO_4$ and $H_2O_2$ was removed from the rectangular exposed portion of the substrate surface, and was rinsed again with D.I. (deionized) water. This cleaning cycle was repeated five times. Then, the substrate 31 was dipped again in a mixed solution of $H_2SO_4$ and $H_2O_2$ having a ratio of 4:1 for about 15 minutes, whereby a thin protective oxide film was formed thereon. It was rinsed with D.I. (deionized) water and dried. Then, the substrate 31 was set on a holder made of molybdenum and placed in a molecular beam epitaxial apparatus including a preparation chamber defining an ultrahigh vacuum having a pressure not exceeding $10^{-10}$ torr. It was heated at 1000° C. for 5–30 minutes in the preparation chamber. Then, it was immediately transferred into an epitaxial chamber and epitaxy was carried out at a rate of 1 μm/h by employing a substrate temperature of 600° C. and a Group V/III molecular beam flux ratio of 3 to grow a Si-doped n-type GaAs crystal layer having a thickness of about 2 μm. As a result, a layer 33 of a single crystal of n-type GaAs having a thickness of 2 μm was formed on the surface of the substrate 31 under the influence of the crystal nature of the silicon substrate, while a high resistance polycrystalline GaAs layer 34 having a thickness of 2 μm was formed on the surface of the insulator layer 32.

Figure 6:
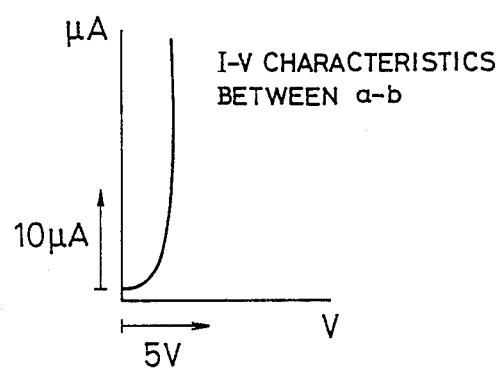
FIG. 6 is a graph showing the current-voltage characteristics of the device of FIG. 5 as measured between points 'a' and 'b'.
Figure 7:
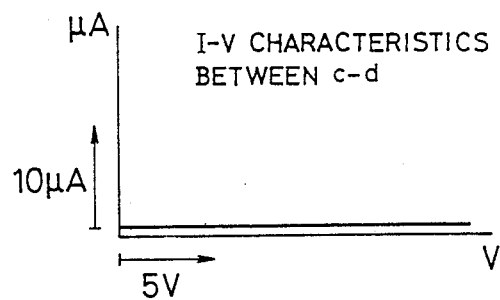
FIG. 7 is a graph showing the current-voltage characteristics of the device of FIG. 5 as measured between points 'c' and 'd'.
Figure 8:
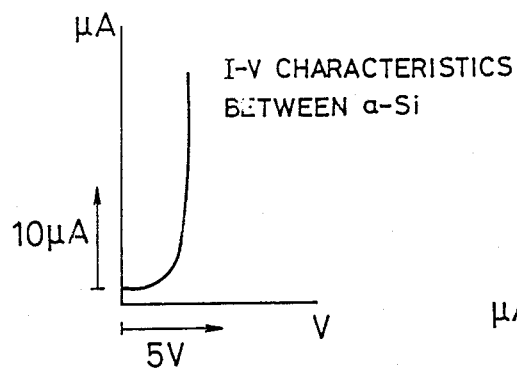
FIG. 8 is a graph showing the current-voltage characteristics of the device of FIG. 5 as measured between point 'a' and a silicon substrate.
Figure 9:
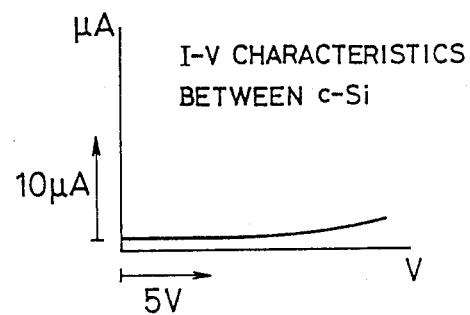
FIG. 9 is a graph showing the current-voltage characteristics of the device of FIG. 5 as measured between point 'c' and the substrate.

Each layer of the device was examined for electrical conductivity. Four probes were connected to the device at points 'a', 'b', 'c' and 'd', respectively, as shown in FIG. 5, and its current-voltage (I-V) characteristics were measured between points 'a' and 'b', between points 'c' and 'd', between point 'a' and the substrate 31 and between point 'c' and the substrate 31 by means of a curve tracer. The results are shown in FIGS. 6 to 9, respectively. The layer 33 on the substrate 31 was so satisfactory that it and the metal of which the probes were made exhibited a Schottky (or rectifying) effect, as is obvious from the I-V characteristics obtained between points 'a' and 'b' (FIG. 6). On the other hand, the layer 34 on the insulator layer 32 hardly passed any current even if a voltage of 30 V or above was applied, as is obvious from the I-V characteristics obtained between points 'c' and 'd' (FIG. 7). It is, therefore, obvious that the layer 34 has so high a resistance that it is useful for the effective isolation of the elements. FIGS. 8 and 9 show the electrical characteristics of heterojunctions between GaAs and Si. The heterojunction between the n-type single-crystal GaAs layer 33 and the silicon substrate 31 showed the rectification characteristics which were characteristic of a p-n junction (FIG. 8). On the other hand, hardly any current was found to flow between the high resistance polycrystalline GaAs layer 34 on the insulator layer 32 and the substrate 31 until a voltage of nearly 20 V was applied. Thus, the presence of the $SiO_2$ layer made a significant difference in the electrical characteristics of the junctions between GaAs and Si.

Figure 10:
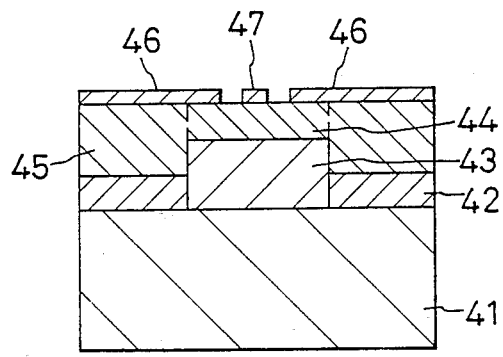
FIG. 10 is a cross sectional view of a compound semiconductor device according to a second example of this invention.

Reference is now made to FIG. 10 showing a device according to a second example of this invention. The device was produced by a method duplicating that which had been employed for producing the device according to the first example, except those aspects which will hereinafter be described. Molecular beam epitaxy was carried out to grow an undoped GaAs layer 43 having a thickness of 2 μm on a substrate 41 and a Si-doped n-type GaAS layer 44 having a thickness of 0.5 μm on the layer 43. The number of silicon atoms in the layer 44 was $10^{17} cm^{-3}$. The device also includes an ohmic electrode 46 formed from an alloy of Au, Ge and Ni by vacuum evaporation and one minute of heat treatment at 380° C. and a Schottky electrode 47 formed from aluminum by vacuum evaporation and defining a gate. The device is a field-effect transistor in which a high resistance polycrystalline GaAs layer 45 having a thickness of 2.5 μm is formed on a layer 42 of $SiO_2$ for isolating the elements. The substrate 41 was formed from high resistance p-type silicon having a resistivity ($\rho$) of 100Ω cm and had a surface in which the silicon crystal had its (100) face, so that the generation of parasitic current, etc. might be prevented.

Figure 11:
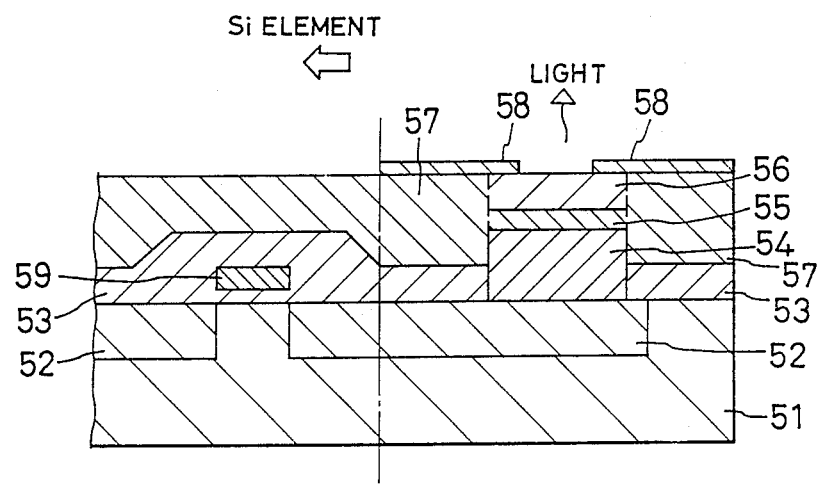
FIG. 11 is a cross sectional view of a compound semiconductor device according to a third example of this invention.

A device according to a third example of this invention is shown in FIG. 11. It includes a GaAs element (light-emitting element) formed on a single crystal of GaAs and a silicon element (MOSFET) formed on a silicon crystal. The GaAs and Si elements are interconnected by a GaAs-Si heterojunction and form an integral body.

The device was manufactured by a method which was basically identical to that which has been employed for making the device according to the first example. Prior to the formation of a GaAs layer by molecular beam epitaxy, an n-type diffusion layer 52 having a resistivity ($\rho$) of 0.1Ω cm was formed in a silicon substrate to form a MOSFET by a customary method. The substrate 51 was of p-type silicon having a resistivity ($\rho$) of 5Ω cm and had a surface in which the silicon crystal had its (100) face. An insulator layer 53 having a thickness of 5000 Å was formed from $SiO_2$ to cover a portion of the substrate surface, while leaving exposed its remaining portion used for interconnection with a GaAs element by a GaAs-Si heterojunction. A gate electrode 59 was formed from n-type polysilicon in the insulator layer 53. Then, a GaAs layer was formed on the exposed surface of the substrate by a method duplicating that which was employed for molecular beam epitaxy according to the first example. The GaAs layer was formed as a combination of a layer 54 of a single crystal of n-type GaAs having a thickness of 2 μm, a layer 55 of a single crystal of p-type GaAs having a thickness of 0.5 μm and a layer 56 of a single crystal of p-type GaAs having a thickness of 0.5 μm which were laid one upon another to form a desired light-emitting diode. A high resistance polycrystalline GaAs layer 57 having a thickness of 3.5 μm was formed on the insulator layer 53 to isolate the elements. An ohmic electrode 58 was formed thereon from an alloy of Au and Zn.

The compound semiconductor device of this invention comprises a substrate formed from a single crystal of silicon, a layer of an insulator formed on a portion of a surface of the substrate, at least one high resistance compound semiconductor layer formed on the insulator layer, and at least one layer of a single crystal of a compound semiconductor formed on the remaining portion of the substrate surface, as hereinabove described. Therefore, it has a variety of advantages as will hereinafter be stated by way of example:

(1) It is possible to form a single crystal of GaAs and a GaAs/AlGaAs heterojunction on a single crystal of silicon and thereby produce a GaAs element in the form of an island which is electrically isolated from any other element by a high resistance polycrystalline GaAs layer;

(2) It is possible to form heterojunction between GaAs and Si which can be effectively utilized for realizing a novel device;

(3) It is possible to form a silicon element on a silicon substrate and connect it with a GaAs element electrically by a heterojunction to thereby form both of the elements into an integral body; and (4) It is possible to produce a device having both of the advantageous properties of silicon and those of GaAs. For example, it is possible to produce a solar cell of high efficiency having the spectral characteristics of silicon and GaAs and thereby capable of admitting light over a wide wavelength range.

The method of this invention essentially comprises the first step of forming a layer of an insulator on a portion of a surface of a substrate formed from a single crystal of silicon, and the second step of forming an appropriate compound semiconductor layer on each of the insulator layer and the remaining portion of the substrate surface directly by molecular beam epitaxy without forming any buffer layer. The insulator layer enables the isolation of the GaAs layer, as well as the silicon element. The method does not include any special isolation technique, such as mesa etching, but facilitates the economical isolation of the elements. It enables the production of the highly integrated semiconductor device, as each isolating layer is required to have a thickness of only 2 or 3 μm.

What is claimed is:

1. A method of manufacturing a compound semiconductor device comprising the steps of:
   forming a layer of an insulator on one portion of a surface of a substrate formed from a single crystal of silicon;
   removing an oxide on a different portion of said substrate surface from said insulator layer and some silicon atoms of said substrate surface under said oxide by heating said substrate at a temperature of at least 1000° C. in an ultrahigh vacuum having a maximum pressure of $10^{-10}$ torr, maintaining said substrate at a temperature of at least 1,000° C. for a time longer than required to desorb an oxide, said time being sufficient to obtain a structure of bi-atomic steps on the substrate surface, lowering the temperature substantially to a range of 550° to 750° C. and then applying to said substrate a molecular beam of one compound semiconductor forming elements which is volatile at a temperature in the range of from 550°-750° C., and applying molecular beams of all of said compound semiconductor forming elements together to said substrate to grow a compound semiconductor by epitaxy, whereby a compound semiconductor layer having a regularly repeating arrangement of atoms is formed on a different portion of said substrate surface from said insulator layer, while a high resistance compound semiconductor layer is formed on said insulator layer.

2. A method as set forth in claim 1, wherein said compound semiconductor forming elements are mainly Group III and V elements.

3. A method as set forth in claim 1, wherein said single crystal of silicon has surface orientation (100), and the temperature at which said substrate is heated in an ultrahigh vacuum ranges from 1000° C. to 1050° C.

4. A method as set forth in claim 2, wherein at least one of Ga and Al is used as said Group III element, As is used as said Group V element, and at least one of GaAs and $Al_xGa_{(1-x)}As$ ($0 < X \leq 1$) is grown by epitaxy on said substrate.

5. A method as set forth in claim 2, wherein the molecular beam of said Group V element has a flux ratio of 1 to 5 to that of said Group III element, and said epitaxy has a rate of 0.5 to 2 μm/h.

6. A method as set forth in claim 1, wherein said heating of said substrate in an ultrahigh vacuum and said epitaxy are carried out in different vacuum chambers.

* * * * *